United States Patent
Kase

(10) Patent No.: US 7,573,332 B1
(45) Date of Patent: Aug. 11, 2009

(54) AMPLIFIER WITH ACTIVE INDUCTOR

(75) Inventor: Kiyoshi Kase, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/039,377

(22) Filed: Feb. 28, 2008

(51) Int. Cl.
*H03F 3/45* (2006.01)
*H03H 11/00* (2006.01)

(52) U.S. Cl. ..................... 330/253; 333/214

(58) Field of Classification Search ............... 330/253; 333/213, 214; 327/63, 65, 563, 565
See application file for complete search history.

(56) References Cited

U.S. PATENT DOCUMENTS

| | | | |
|---|---|---|---|
| 5,726,613 A | 3/1998 | Hayashi et al. | |
| 6,784,749 B1 | 8/2004 | Cove | |
| 7,253,707 B2 | 8/2007 | Mukhopadhy et al. | |
| 7,308,241 B2 | 12/2007 | Shimada et al. | |
| 2009/0074048 A1* | 3/2009 | Amin et al. | 375/229 |

* cited by examiner

*Primary Examiner*—Robert Pascal
*Assistant Examiner*—Khiem D Nguyen
(74) *Attorney, Agent, or Firm*—James L. Clingan, Jr.; Daniel D. Hill

(57) ABSTRACT

An amplifier comprises an amplifier stage and an active inductor. The amplifier stage has an input terminal and an output terminal. The active inductor comprises first and second resistors and first and second transistors. The first resistor has a first terminal coupled to the output terminal of the amplifier stage, and a second terminal. The second resistor has a first terminal coupled to the output terminal of the amplifier stage, and a second terminal. The first transistor has a first current electrode coupled to the second terminal of the first resistor, a control electrode coupled to receive a bias voltage, and a second current electrode. The second transistor has a first current electrode coupled to the second current electrode of the first transistor, a control electrode coupled to the second terminal of the second resistor, and a second current electrode coupled to a first power supply voltage terminal.

20 Claims, 3 Drawing Sheets

AMPLIFIER WITH ACTIVE INDUCTOR

BACKGROUND

1. Field

This disclosure relates generally to amplifiers, and more specifically, to amplifiers having an active inductor.

2. Related Art

Systems that have circuits that are operating at especially high frequencies raise problems that arise due to the high frequency. For example, when a signal has to traverse a distance, parasitic capacitance increases as the distance increases. The parasitic capacitance acts as a low pass filter so that as the distance increases the high frequency is attenuated more and more. Another adverse effect of high frequency is what is called the "skin effect." As the frequency increases the current is conducted more and more along the surface of the conductor. With less of the conductor carrying current, the resistance increases for a given conductor as the frequency increases. Thus, the inherent low pass filter arising from the series resistance increase and the parasitic adversely impacts the ability to operate at higher frequencies.

To offset the low pass filter, a high pass filter may be introduced. One approach is to use an inductor, passive or active, that can offset the effects of the low pass filter. Passive inductors can require a significant amount of space on an integrated circuit and thus add significant cost. Depending on the particular type of passive inductor, the inductance can be difficult to control. Active inductors also tend to be difficult to control.

Accordingly there is a need for an amplifier to offset the adverse effects of high frequency operation in a manner that overcomes or improves upon the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A system has an amplifier. The amplifier may be divided into multiple stages. One stage has an input amplifier and an output which serves as the output of the stage as well as an input to an active inductor circuit. The active inductor circuit has a pair of transistors coupled in series. One of the pair is biased with a reference. The other transistor has a gate coupled to a first terminal of a first resistor. The other terminal of the first resistor is coupled to the output of the input amplifier. One end of the transistor pair is coupled to a power supply terminal such as ground. The other end of the transistor pair is coupled to one end of a second resistor. The other end of the second resistor is coupled to the output of the input amplifier. The resistance of the first resistor is useful in setting where a gain that increases with frequency becomes relevant. The second resistor is useful in setting the D.C. gain. Each stage can be made to operate and be tuned in the same way. The result is that the amplifier can be used to offset the adverse effects of the inherent low pass filter that may occur due to line resistance that is compounded by the skin effect at high frequencies and the increased parasitic capacitance as distance increases. This is better understood by reference to the drawings and the following description.

Figure 1:
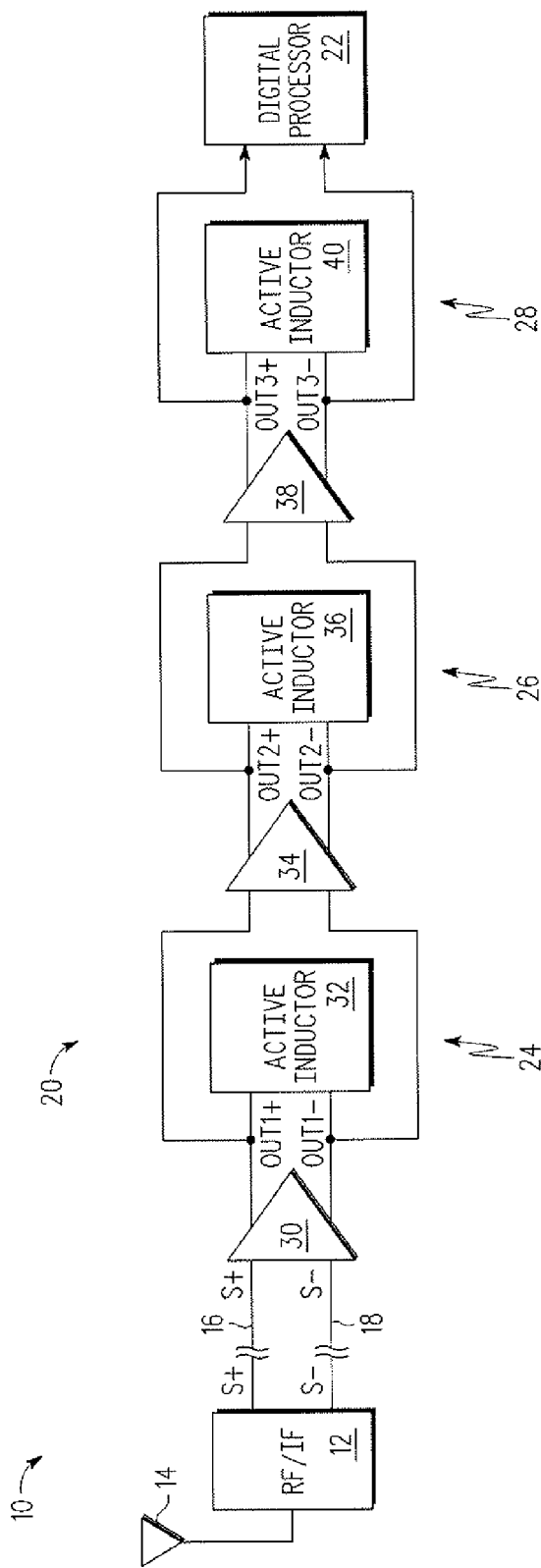
FIG. 1 is a block diagram of a system having an amplifier according to an embodiment.

Shown in FIG. 1 is a system 10 comprising an RF/IF circuit 12, an antenna 14, a transmission line 16, a transmission line 18, an amplifier 20, and a digital processor 22. Amplifier 20 and processor 22 may be on the same integrated circuit. RF/IF circuit 12 is a different integrated circuit. Amplifier 20 comprises stages 24, 26, and 28. Stage 24 comprises an amplifier 30 and an active inductor 32. Stage 26 comprises an amplifier 34 and an active inductor 36. Stage 28 comprises an amplifier 38 and an active inductor 40. Antenna 14 is coupled to RF/IF circuit 12. RF/IF circuit 12 has a first output for providing a signal S+ coupled to transmission line 16 and a second output for providing a signal S− coupled to transmission line 18. Signals S+ and S− are, in this example, described as complementary analog signals. Transmission lines 16 and 18 may be a twisted pair. Amplifier 30 has a first input coupled to transmission line 16, a second input coupled to transmission line 18, a first output for providing an output signal OUT1+, and a second output for providing an output signal OUT1−. Active inductor 32 has a first terminal coupled to the first output of amplifier 30 and a second terminal coupled to the second output of amplifier 30. Amplifier 34 has a first input coupled the first output of amplifier 30, a second input coupled to the second output of amplifier 30, a first output for providing an output signal OUT2+, and a second output for providing an output signal OUT2−. Active inductor 36 has a first terminal coupled to the first output of amplifier 34 and a second terminal coupled to the second output of amplifier 34. Amplifier 38 has a first input coupled the first output of amplifier 34, a second input coupled to the second output of amplifier 34, a first output for providing an output signal OUT3+, and a second output for providing an output signal OUT3−. Active inductor 40 has a first terminal coupled to the first output of amplifier 38 and a second terminal coupled to the second output of amplifier 38. Transmission lines 16 and 18 may traverse a distance between RF/IF circuit and amplifier 20 that is long relative to the sizes of RF/IF circuit 12 and amplifier 20. A long distance in this example may be ten centimeters or even less. System 10 may be a cellular handset and RF/IF circuit 12 may be a radio frequency front-end.

In one type of operation, antenna 14 receives an RF signal which is coupled to RF/IF circuit 12 where the RF signal is processed. RF/IF circuit 12 provides two high frequency signals S+ and S− to transmission lines 16 and 18, respectively. Signals S+ and S− are considered analog signals but may contain digital information. Transmission lines 16 and 18 have substantial parasitic capacitance, especially due to the relatively long distance being traversed from RF/IF circuit 12 to amplifier 20. Because signal S+ and S− are high frequency signals, the resistance is increased due to skin effect that causes an increase in resistance at high frequency. Thus, the inherent low pass filter of transmission lines 16 and 18 attenuates signals S+ and S− at high frequencies so that signals S+ and S− received by amplifier 30 has a reduced level at the high frequencies that are desired. For example, a frequency of 5 gigahertz may be considered a high frequency. As dimensions shrink, distances become less, and with other improvements, the point where the adverse impact by the inherent low pass filter on transmission lines 16 and 18 may not become serious until higher frequencies are reached. On the other hand, other circumstances such as a lower diameter wire and longer distances could result in a higher resistance that causes a serious adverse impact due to the inherent low pass filter.

Amplifier 30 receives signals S+ and S− and amplifies them differentially. Active inductor 32 has the effect of actually increasing the gain at the high frequency. Thus the result is that the gain of stage 24 is actually higher at the high frequency than at lower frequencies. Thus outputs OUT1+ and OUT1− have improved signal levels at the higher frequencies and also that all of the frequencies having higher signal levels. Stage 24 thus provides an overall gain plus some extra gain at the high frequency. Amplifier 34 receives outputs OUT2+ and OUT2− and amplifies them. The overall gain is less than that of amplifier 30. Active inductor 36 causes a larger gain at the high frequency compared to the overall gain than active inductor 32 did compared to the overall gain provided by amplifier 30. Stage 26 thus provides outputs OUT2+ and OUT2− with additional gain and a further increase at the high frequency. Amplifier 38 receives outputs OUT2+ and OUT2− and amplifies them. The overall gain is less than that of amplifier 34. Active inductor 40 causes a larger gain at the high frequency compared to the overall gain than active inductor 36 did compared to the overall gain provided by amplifier 34. Stage 28 thus provides outputs OUT3+ and OUT3− with additional gain and a further and more substantial increase at the high frequency. Digital processor 22 receives outputs OUT3+ and OUT3− and provides the necessary operations to utilize the digital information provided from the analog signals amplified and tailored by amplifier 20.

Figure 2:
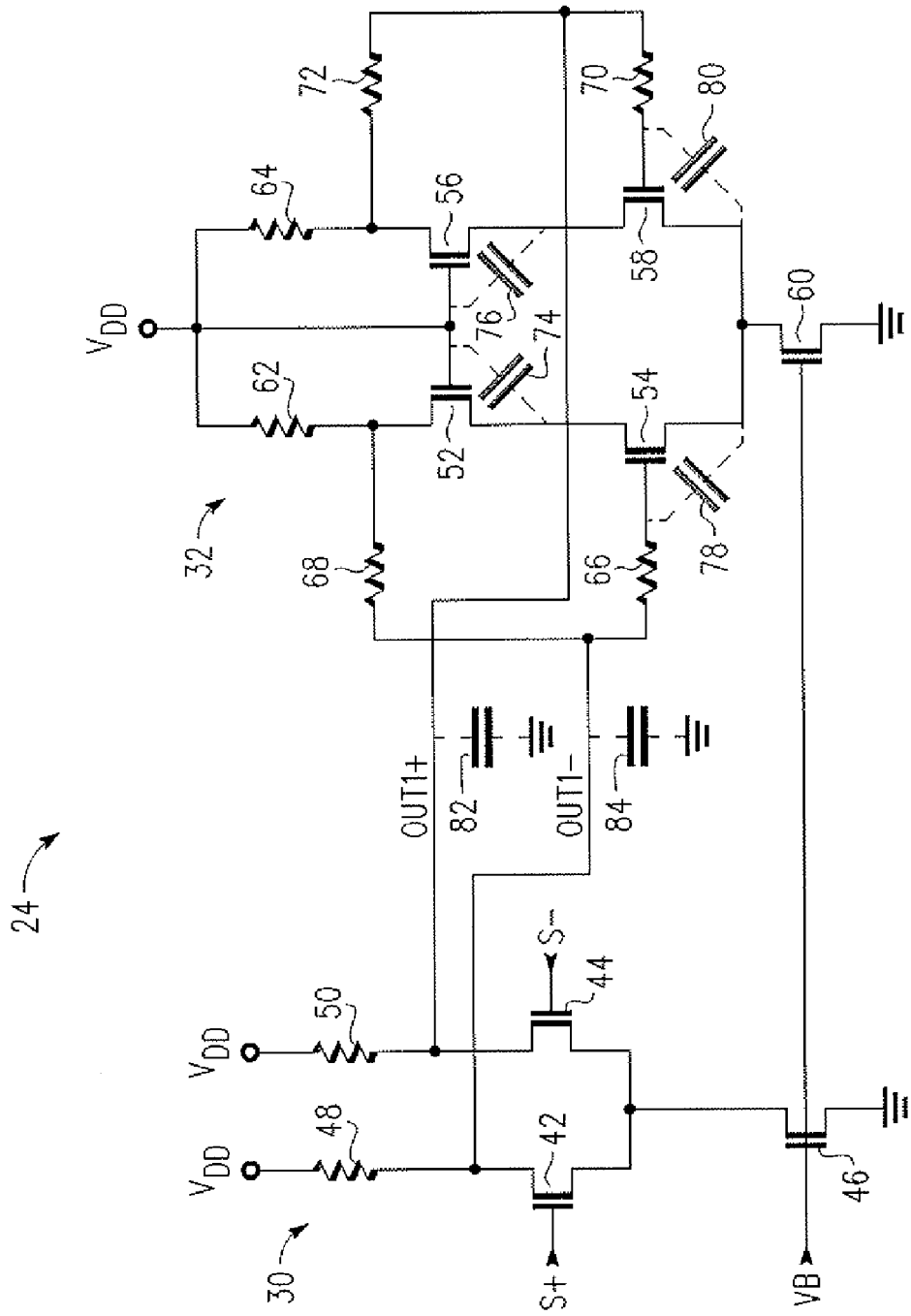
FIG. 2 is a circuit diagram of a portion of the system of FIG. 1.

FIG. 2 is a circuit diagram of stage 24 comprising amplifier 30 and active inductor 32. Amplifier 30 comprises transistors 42, 44, and 46 and resistors 48 and 50. Active inductor 32 comprises transistors 52, 54, 56, 58, and 60 and resistors 62, 64, 66, 68, 70, and 72. Although not separately created elements, also present are capacitors 74, 76, 78, and 80 which represent the inherent gate to source capacitances of transistors 52, 56, 54, and 58, respectively. In addition capacitors 82 and 84, which are not separately created capacitors, are shown connected to the lines connecting amplifier 30 and active inductor 32. Capacitors 82 and 84 are representative of the parasitic capacitance on the lines connecting amplifier 30 and active inductor 32. All of the transistors are N channel transistors. This is generally preferable because they are faster by having a higher mobility for a given size and thus for a given capacitance. P channels are not precluded however. These are transistors of the type sometimes referenced as metal-oxide semiconductor (MOS) transistors even though they typically have polysilicon gates. All of the resistors are preferably made of polysilicon which is typically a convenient way to make a resistor. Another type of resistor may also be useful, especially if their value can be controlled.

Transistor 42 has a gate for receiving signal S+, a drain, and a source. Transistor 44 has a gate for receiving signal S−, a drain, and a source. Transistor 46 has a drain connected to the sources of transistors 42 and 44, a gate for receiving a bias voltage VB, and a source connected to a negative power supply terminal, which is ground in this example. Resistor 48 has a first terminal connected to the drain of transistor 42 and a second terminal connected to a positive power supply terminal shown as VDD. Resistor 50 has a first terminal connected to the drain of transistor 44 and a second terminal connected to VDD. Output OUT1− is at the connection of the first terminal of resistor 48 and the drain of transistor 42. Output OUT1+ is at the connection of the first terminal of resistor 50 and the drain of transistor 44. Transistor 52 has a gate connected to VDD, a drain, and a source. Transistor 54 has a drain connected to the source of transistor 52, a gate, and a source. Transistor 56 has a gate connected to VDD, a drain, and a source. Transistor 58 has a drain connected to the source of transistor 56, a gate, and a source. Transistor 60 has a drain connected to the sources of transistors 54 and 58, a gate for receiving bias voltage VB, and a source connected to ground. Resistor 62 has a first terminal connected to the drain of transistor 52 and a second terminal connected to VDD. Resistor 64 has a first terminal connected to the drain of transistor 56 and a second terminal connected to VDD. Resistor 66 has a first terminal connected to the drain of transistor 42 and a second terminal connected to the gate of transistor 54. Resistor 68 has a first terminal connected to the drain of transistor 42 and a second terminal connected to the drain of transistor 52. Resistor 70 has a first terminal connected to the drain of transistor 44 and a second terminal connected to the gate of transistor 58. Resistor 72 has a first terminal connected to the drain of transistor 44 and a second terminal connected to the drain of transistor 56.

In operation, amplifier 30 functions as a differential amplifier to differentially amplify signals S+ and S−. At lower frequencies, active inductor 32 has a relatively uniform effect on OUT1+ and OUT1− and is influenced by the resistance of resistors 68 and 72.

Using output OUT1− as the example, current through transistors 52, 54, and resistor 68. As output OUT1− rises, transistor 54 becomes more conductive thus pulling more current through transistor 52 and resistor 68. The current being pulled through resistor 68 tends to reduce the voltage on output OUT1−. This effect continues uniformly for the lower frequencies so that that the dampening of the gain caused by active inductor 32 is also uniform. Also the dampening effect is inversely related to the resistance of resistor 68. That is the higher the resistance of resistor 68 the less is the dampening effect. With the dampening effect reduced with increases in the resistance of resistor 68, the overall gain of stage 24 thus increases with increases in the resistance of resistor 68. As the high frequency is approached, the impedance of capacitor 78 begins reducing as does the impedance of capacitor 74. With capacitor 74 at a low resistance, the gate to source voltage begins reducing making transistor 52 less conductive thus reducing the dampening effect on output OUT1−. Capacitor 78 has a similar effect on transistor 54 by reducing the gate to source voltage at the high frequency. In the case of transistor 54, resistor 66 is acting as a voltage divider with capacitor 78. The frequency at which the dampening begins being reduced is effected by the resistance chosen for resistor 66. There is an RC time constant effect. This may be viewed as the inductor value of active inductor 32 being substantially equal to the gate-to-source parasitic capacitance of transistor 54, which is capacitor 78, multiplied by the resistance value of resistor 66. The operation described for output OUT1− is analogous for output OUT1+.

Figure 3:
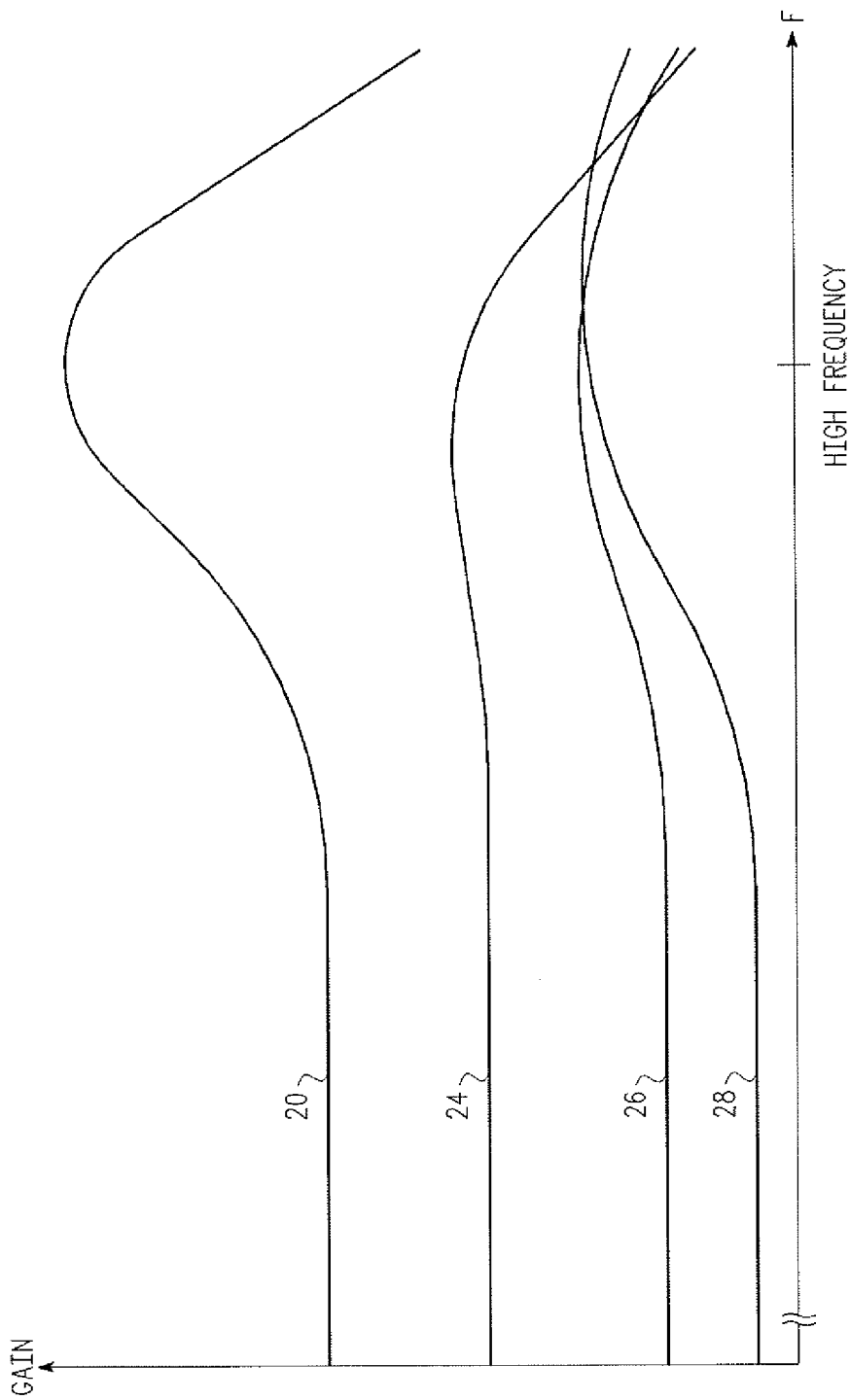
FIG. 3 is a graph showing characteristics of the amplifier of FIG. 1.

Shown in FIG. 3 is gain as a function of frequency for stages 24, 26, and 28 and the resulting combination for amplifier 20. For stage 24, the dampening is chosen, by choosing resistors 68 and 72 to be relatively high, to be relatively low so that when the dampening reduction occurs at the high frequency, the dampening effect holds the gain for the high frequency with a slight increase. This has the primary effect of extending the flat gain for the high frequency for stage 24. For stage 26, which is constructed the same as stage 24 except has resistors analogous to resistors 68 and 72 set to a lower resistance. This increases the dampening effect and thus decreases the overall gain until the high frequency is approached. For the high frequency, the dampening is again reduced but in this case there is a greater reduction in dampening because the dampening began at a higher level. The result is that the gain at high frequency is significantly higher than for the gain at the lower frequencies. For stage 28, which is also constructed the same as stage 24 except has resistors analogous to resistors 68 and 72 set to an even lower resistance than that set for stage 26. In such case the dampening is even greater so that there is an even greater difference between the gain as dampened at the lower frequencies as compared to the gain at the high frequency. The result of stages 24, 26, and 28 is an overall gain that is at elevated level for low frequencies but at a much increased level for the high frequency. There is then gain at the lower frequencies but an even higher gain at the high frequency where there would be a reduced input level due to the attenuation of the input signals S+ and S− due to the increased resistance due to skin effect and the increased adverse impact of the inherent low pass filter.

The frequency at which the dampening is decreased is selected by choosing the resistance of resistors 66 and 70. The magnitude of the dampening of the gain is selected by choosing the resistance of resistors 68 and 72. The difference between the high frequency gain and the lower frequency gain is also related to the resistance level chosen for resistors 68 and 72. Capacitors 82 and 84 contribute to limiting the frequency response of stage 24. Transistors 54, 58, 42, and 44 are chosen to have the same transconductance. Due to process variations, the actual value of transconductance is difficult to know except within a wide range. The ability to match the transconductance, however, of transistors on the same integrated circuit, especially those in close proximity, is very high. For example, the channel length to channel width ratio, which directly relates to transconductance, may vary from the intended design but transistors on the same integrated circuit change in the same way. In this case, a wide range of transconductances are acceptable so long as the transconductances match. The magnitude of the dampening effect is related to the transconductance of transistors 54 and 58. The gain provided by amplifier 30 is related to the transconductance of transistors 42 and 44. Thus, an increase in transconductance on these four transistors causes an increase in the dampening effect but also an offsetting increase in the gain of amplifier 30. Thus the gain is determined by resistors 68 and 72.

By now it should be appreciated that there has been provided an amplifier having an amplifier stage and an inductor. The amplifier stage has an input terminal and an output terminal. The active inductor comprises a first resistor having a first terminal coupled to the output terminal of the amplifier stage, and a second terminal, a second resistor having a first terminal coupled to the output terminal of the amplifier stage, and a second terminal, a first transistor having a first current electrode coupled to the second terminal of the first resistor, a control electrode coupled to receive a bias voltage, and a second current electrode, and a second transistor having a first current electrode coupled to the second current electrode of the first transistor, a control electrode coupled to the second terminal of the second resistor, and a second current electrode coupled to a first power supply voltage terminal. The amplifier may be further characterized by a transconductance of the first transistor being substantially equal to a transconductance of the second transistor. The amplifier may be further characterized by the transconductance of the first and second transistors being at least partially determined by a transistor channel width to length ratio of the first and second transistors. The amplifier may be further characterized by a voltage gain of the active inductor being substantially independent of a transconductance of the first and second transistors. The amplifier may be further characterized by the first and second resistors being implemented using polysilicon on an integrated circuit. The amplifier may be further characterized by a first resistance value of the first resistor at least partially determining a first voltage gain of the amplifier for a first predetermined frequency, and a second resistance value of the second resistor at least partially determining a second voltage gain of the amplifier for a second predetermined frequency, wherein the second predetermined frequency is higher than the first predetermined frequency. The amplifier may be further characterized by the amplifier stage comprising a third resistor having a first terminal coupled to a second power supply voltage terminal, and a second terminal coupled to the output terminal of the amplifier stage, and a third transistor having a first current electrode coupled to the second terminal of the third resistor, a control electrode for receiving an input signal, and a second current electrode coupled to the first power supply voltage terminal. The amplifier may be further characterized by the amplifier stage further comprising a fourth resistor having a first terminal coupled to the second power supply voltage terminal, and a second terminal, and a fourth transistor having a first current electrode coupled to second terminal of the fourth resistor, a control electrode for receiving a second input signal, and a second current electrode coupled to the first power supply voltage terminal. The amplifier may be further characterized by the active inductor further comprising a fifth resistor having a first terminal coupled to the second power supply voltage terminal, and a second terminal coupled to the first current electrode of the first transistor, a sixth resistor having a first terminal coupled to the second power supply voltage terminal, and a second terminal, a seventh resistor having a first terminal coupled to the second terminal of the sixth resistor, and a second terminal coupled to the second terminal of the fourth resistor, an eighth resistor having a first terminal coupled to the second terminal of the fourth resistor, and a second terminal, a fifth transistor having a first current electrode coupled to the second terminal of the sixth resistor, a control electrode coupled to the second power supply voltage terminal, and a second current electrode, and a sixth transistor having a first current electrode coupled to the second current electrode of the fifth transistor, a control electrode coupled to the second terminal of the eighth resistor, and a second current electrode coupled to the first power supply voltage terminal. The amplifier may be further characterized by the first and second transistors being characterized as being metal-oxide semiconductor (MOS) transistors and an inductor value of the active inductor is substantially equal to a gate-to-source parasitic capacitance of the second transistor multiplied by a resistance value of the second resistor. The amplifier may be further characterized by the input terminal being for receiving a low voltage digital signal (LVDS) from a radio frequency front-end of a cellular handset.

Also disclosed is an amplifier having an amplifier stage and an active inductor. The amplifier stage has an input terminal and an output terminal. The amplifier stage comprises a first resistor having a first terminal coupled to a first power supply voltage terminal, and a second terminal coupled to the output terminal of the amplifier stage, and a first transistor having a first current electrode coupled to the second terminal of the first resistor, a control electrode for receiving an input signal, and a second current electrode coupled to a second power supply voltage terminal. The active inductor comprises a second resistor having a first terminal coupled to the output terminal of the amplifier stage, and a second terminal, a third resistor having a first terminal coupled to the output terminal of the amplifier stage, and a second terminal, a second transistor having a first current electrode coupled to the second terminal of the second resistor, a control electrode coupled to receive a bias voltage, and a second current electrode, and a third transistor having a first current electrode coupled to the second current electrode of the second transistor, a control electrode coupled to the second terminal of the third resistor, and a second current electrode coupled to the second power supply voltage terminal. The amplifier may be further characterized by the bias voltage being equal to a power supply voltage provided to the first power supply voltage terminal. The amplifier may be further characterized by a transconductance of the second and third transistors being at least partially determined by a transistor channel width to length ratio of the second and third transistors. The amplifier may be further characterized by a voltage gain of the active inductor being substantially independent of a transconductance of the second and third transistors. The amplifier may be further characterized by a first resistance value of the second resistor at least partially determining a first voltage gain of the amplifier for a first predetermined frequency, and a second resistance value of the third resistor at least partially determining a second voltage gain of the amplifier for a second predetermined frequency, wherein the second predetermined frequency is higher than the first predetermined frequency. The amplifier may be further characterized by the amplifier stage being a differential amplifier further comprising. The amplifier may be further characterized by a fourth resistor having a first terminal coupled to the first power supply voltage terminal, and a second terminal for providing a second output terminal of the amplifier stage and a fourth transistor having a first current electrode coupled to the second terminal of the fourth resistor, a control electrode for receiving a second input signal, and a second current electrode coupled to the second power supply voltage terminal.

Also described is an amplifier having an amplifier stage and an active inductor. The amplifier stage has an input terminal and an output terminal. The amplifier stage comprises a first resistor having a first terminal coupled to a first power supply voltage terminal, and a second terminal coupled to the output terminal of the amplifier stage, a first transistor having a first current electrode coupled to the second terminal of the first resistor, a control electrode for receiving an input signal, and a second current electrode, and a first current source having a first terminal coupled to the second current electrode of the first transistor and a second terminal coupled to a second power supply voltage terminal. The active inductor comprises a second resistor having a first terminal coupled to the first power supply voltage terminal, and a second terminal, a third resistor having a first terminal coupled to the output terminal of the amplifier stage, and a second terminal coupled to the second terminal of the second resistor, a fourth resistor having a first terminal coupled to the output terminal of the amplifier stage, and a second terminal, a second transistor having a first current electrode coupled to the second terminal of the second and third resistors, a control electrode coupled to receive a bias voltage, and a second current electrode, a third transistor having a first current electrode coupled to the second current electrode of the second transistor, a control electrode coupled to the second terminal of the fourth resistor, and a second current electrode, and a second current source having a first terminal coupled to the second current electrode of the third transistor, and a second terminal coupled to the second power supply voltage terminal. The amplifier may further comprise a fifth resistor having a first terminal coupled to the first power supply voltage terminal, and a second terminal for providing a second output terminal of the amplifier stage, a fourth transistor having a first current electrode coupled to the second terminal of the fifth resistor, a control electrode for receiving a second input signal, and a second current electrode coupled to the first terminal of the first current source, a sixth resistor having a first terminal coupled to the first power supply voltage terminal, and a second terminal, a seventh resistor having a first terminal coupled to the second terminal of the sixth resistor, and a second terminal coupled to the second output terminal of the amplifier stage, an eighth resistor having a first terminal coupled to the second terminal of the seventh resistor, and a second terminal, a fifth transistor having a first current electrode coupled to the second terminal of the sixth resistor, a control electrode coupled to receive the bias voltage, and a second current electrode, a sixth transistor having a first current electrode coupled to the second current electrode of the fifth transistor, a control electrode coupled to the second terminal of the eighth resistor, and a second current electrode coupled to the first terminal of the second current source. The amplifier may be further characterized by the input signal and the second input signal being together characterized as being a differential low voltage digital signal (LVDS) from a radio frequency (RF) front-end of a cellular handset.

Although the invention is described herein with reference to specific embodiments, various modifications and changes can be made without departing from the scope of the present invention as set forth in the claims below. For example, three stages were described for an amplifier. There may, however, be any number, including just one, as desired. One stage may be adequate and provide for lower cost. More than three may be desired to optimize the operation. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. An amplifier comprising:
 an amplifier stage having an input terminal and an output terminal; and
 an active inductor comprising:
  a first resistor having a first terminal coupled to the output terminal of the amplifier stage, and a second terminal;
  a second resistor having a first terminal coupled to the output terminal of the amplifier stage, and a second terminal;
  a first transistor having a first current electrode coupled to the second terminal of the first resistor, a control electrode coupled to receive a bias voltage, and a second current electrode; and
  a second transistor having a first current electrode coupled to the second current electrode of the first transistor, a control electrode coupled to the second terminal of the second resistor, and a second current electrode coupled to a first power supply voltage terminal.

2. The amplifier of claim 1, wherein a transconductance of the first transistor is substantially equal to a transconductance of the second transistor.

3. The amplifier of claim 2, wherein the transconductance of the first and second transistors is at least partially determined by a transistor channel width to length ratio of the first and second transistors.

4. The amplifier of claim 1, wherein a voltage gain of the active inductor is substantially independent of a transconductance of the first and second transistors.

5. The amplifier of claim 1, wherein the first and second resistors are implemented using polysilicon on an integrated circuit.

6. The amplifier of claim 1, wherein a first resistance value of the first resistor at least partially determines a first voltage gain of the amplifier for a first predetermined frequency, and a second resistance value of the second resistor at least partially determines a second voltage gain of the amplifier for a second predetermined frequency, wherein the second predetermined frequency is higher than the first predetermined frequency.

7. The amplifier of claim 1, wherein the amplifier stage comprises:
a third resistor having a first terminal coupled to a second power supply voltage terminal, and a second terminal coupled to the output terminal of the amplifier stage; and
a third transistor having a first current electrode coupled to the second terminal of the third resistor, a control electrode for receiving an input signal, and a second current electrode coupled to the first power supply voltage terminal.

8. The amplifier of claim 7, wherein the amplifier stage further comprises:
a fourth resistor having a first terminal coupled to the second power supply voltage terminal, and a second terminal; and
a fourth transistor having a first current electrode coupled to second terminal of the fourth resistor, a control electrode for receiving a second input signal, and a second current electrode coupled to the first power supply voltage terminal.

9. The amplifier of claim 8, wherein the active inductor further comprises:
a fifth resistor having a first terminal coupled to the second power supply voltage terminal, and a second terminal coupled to the first current electrode of the first transistor;
a sixth resistor having a first terminal coupled to the second power supply voltage terminal, and a second terminal;
a seventh resistor having a first terminal coupled to the second terminal of the sixth resistor, and a second terminal coupled to the second terminal of the fourth resistor;
an eighth resistor having a first terminal coupled to the second terminal of the fourth resistor, and a second terminal;
a fifth transistor having a first current electrode coupled to the second terminal of the sixth resistor, a control electrode coupled to the second power supply voltage terminal, and a second current electrode; and
a sixth transistor having a first current electrode coupled to the second current electrode of the fifth transistor, a control electrode coupled to the second terminal of the eighth resistor, and a second current electrode coupled to the first power supply voltage terminal.

10. The amplifier of claim 1, wherein the first and second transistors are characterized as being metal-oxide semiconductor (MOS) transistors and an inductor value of the active inductor is substantially equal to a gate-to-source parasitic capacitance of the second transistor multiplied by a resistance value of the second resistor.

11. The amplifier of claim 1, wherein the input terminal is for receiving a low voltage digital signal (LVDS) from a radio frequency front-end of a cellular handset.

12. An amplifier comprising:
an amplifier stage having an input terminal and an output terminal, the amplifier stage comprising:
a first resistor having a first terminal coupled to a first power supply voltage terminal, and a second terminal coupled to the output terminal of the amplifier stage; and
a first transistor having a first current electrode coupled to the second terminal of the first resistor, a control electrode for receiving an input signal, and a second current electrode coupled to a second power supply voltage terminal; and
an active inductor comprising:
a second resistor having a first terminal coupled to the output terminal of the amplifier stage, and a second terminal;
a third resistor having a first terminal coupled to the output terminal of the amplifier stage, and a second terminal;
a second transistor having a first current electrode coupled to the second terminal of the second resistor, a control electrode coupled to receive a bias voltage, and a second current electrode; and
a third transistor having a first current electrode coupled to the second current electrode of the second transistor, a control electrode coupled to the second terminal of the third resistor, and a second current electrode coupled to the second power supply voltage terminal.

13. The amplifier of claim 12, wherein the bias voltage is equal to a power supply voltage provided to the first power supply voltage terminal.

14. The amplifier of claim 12, wherein a transconductance of the second and third transistors is at least partially determined by a transistor channel width to length ratio of the second and third transistors.

15. The amplifier of claim 12, wherein a voltage gain of the active inductor is substantially independent of a transconductance of the second and third transistors.

16. The amplifier of claim 12, wherein a first resistance value of the second resistor at least partially determines a first voltage gain of the amplifier for a first predetermined frequency, and a second resistance value of the third resistor at least partially determines a second voltage gain of the amplifier for a second predetermined frequency, wherein the second predetermined frequency is higher than the first predetermined frequency.

17. The amplifier of claim 12, wherein the amplifier stage is a differential amplifier further comprising:
a fourth resistor having a first terminal coupled to the first power supply voltage terminal, and a second terminal for providing a second output terminal of the amplifier stage; and
a fourth transistor having a first current electrode coupled to the second terminal of the fourth resistor, a control electrode for receiving a second input signal, and a second current electrode coupled to the second power supply voltage terminal.

18. An amplifier comprising:

an amplifier stage having an input terminal and an output terminal, the amplifier stage comprising:
- a first resistor having a first terminal coupled to a first power supply voltage terminal, and a second terminal coupled to the output terminal of the amplifier stage;
- a first transistor having a first current electrode coupled to the second terminal of the first resistor, a control electrode for receiving an input signal, and a second current electrode; and
- a first current source having a first terminal coupled to the second current electrode of the first transistor and a second terminal coupled to a second power supply voltage terminal; and an active inductor comprising:
- a second resistor having a first terminal coupled to the first power supply voltage terminal, and a second terminal;
- a third resistor having a first terminal coupled to the output terminal of the amplifier stage, and a second terminal coupled to the second terminal of the second resistor;
- a fourth resistor having a first terminal coupled to the output terminal of the amplifier stage, and a second terminal;
- a second transistor having a first current electrode coupled to the second terminal of the second and third resistors, a control electrode coupled to receive a bias voltage, and a second current electrode;
- a third transistor having a first current electrode coupled to the second current electrode of the second transistor, a control electrode coupled to the second terminal of the fourth resistor, and a second current electrode; and
- a second current source having a first terminal coupled to the second current electrode of the third transistor, and a second terminal coupled to the second power supply voltage terminal.

19. The amplifier of claim 18, further comprising:
- a fifth resistor having a first terminal coupled to the first power supply voltage terminal, and a second terminal for providing a second output terminal of the amplifier stage;
- a fourth transistor having a first current electrode coupled to the second terminal of the fifth resistor, a control electrode for receiving a second input signal, and a second current electrode coupled to the first terminal of the first current source;
- a sixth resistor having a first terminal coupled to the first power supply voltage terminal, and a second terminal;
- a seventh resistor having a first terminal coupled to the second terminal of the sixth resistor, and a second terminal coupled to the second output terminal of the amplifier stage;
- an eighth resistor having a first terminal coupled to the second terminal of the seventh resistor, and a second terminal;
- a fifth transistor having a first current electrode coupled to the second terminal of the sixth resistor, a control electrode coupled to receive the bias voltage, and a second current electrode; and
- a sixth transistor having a first current electrode coupled to the second current electrode of the fifth transistor, a control electrode coupled to the second terminal of the eighth resistor, and a second current electrode coupled to the first terminal of the second current source.

20. The amplifier of claim 19, wherein the input signal and the second input signal are together characterized as being a differential low voltage digital signal (LVDS) from a radio frequency (RF) front-end of a cellular handset.

* * * * *